(12) United States Patent
Sharma et al.

(10) Patent No.: US 6,507,513 B1
(45) Date of Patent: Jan. 14, 2003

(54) USING DELAYED ELECTRICAL PULSES WITH MAGNETO-RESISTIVE DEVICES

(75) Inventors: Manish Sharma, Mountain View, CA (US); Manoj Bhattacharyya, Cupertino, CA (US); Lung The Tran, Saratoga, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 10/176,179

(22) Filed: Jun. 20, 2002

(51) Int. Cl.[7] .............................................. G11C 11/14
(52) U.S. Cl. ....................... 365/158; 365/173; 365/171; 365/51; 365/194; 365/191
(58) Field of Search ................................ 365/158, 148, 365/171, 173, 51, 66, 63, 194, 191

(56) References Cited

U.S. PATENT DOCUMENTS 4,554,464 A * 11/1985 Davies et al. ............... 327/172

* cited by examiner

*Primary Examiner*—Andrew Q. Tran

(57) ABSTRACT

A device having a magneto-resistive element, a first conductor proximate to the magneto-resistive element, and a second conductor proximate to the magneto-resistive element. The magneto-resistive element is exposed to a magnetic field generated by a first electrical pulse carried by the first conductor. The magneto-resistive element is also exposed to a magnetic field generated by a second electrical pulse carried by the second conductor. The second electrical pulse is delayed relative to the first electrical pulse.

20 Claims, 6 Drawing Sheets

1010

1010

1010

1010

USING DELAYED ELECTRICAL PULSES WITH MAGNETO-RESISTIVE DEVICES

TECHNICAL FIELD

The present invention relates to magneto-resistive devices. More specifically, the present invention relates to the timing of electrical pulses used with magneto-resistive elements.

BACKGROUND

Magneto-resistive devices include tunneling magneto-resistive (TMR) devices and giant magneto-resistive (GMR) devices. As these types of devices are known in the art, only a general description is provided herein.

A typical TMR device includes a pinned layer (or reference layer), a sense layer (or data layer, pre-layer, or bit layer), and an insulating tunnel barrier sandwiched between the pinned and sense layers. The pinned layer has a magnetization orientation that is fixed so as not to rotate in the presence of an applied magnetic field in a range of interest. The sense layer has a magnetization that can be oriented in either of two directions: the same direction as the pinned layer magnetization, or the opposite direction of the pinned layer magnetization. If the magnetization of the pinned layer and the magnetization of the sense layer are in the same direction, the orientation of the TMR device is said to be "parallel." If the magnetization of the pinned layer and the magnetization of the sense layer are in opposite directions, the orientation of the TMR device is said to be "anti-parallel."

A GMR device has the same basic configuration as a TMR device, except that the data (sense) and reference (pinned) layers are separated by a conductive non-magnetic metallic layer instead of an insulating tunnel barrier. Similar to a TMR device, the data and reference layers of a GMR device can have either parallel or anti-parallel orientations.

These two stable orientations, parallel and anti-parallel, may correspond to logic values of zero (0) and one (1). As such, the magneto-resistive devices are suited for use in memory devices commonly referred to s magnetic random access memory (MRAM) devices. MRAM is a non-volatile memory that is being considered for short-term and long-term data storage. MRAM has lower power consumption than short-term memory such as DRAM (dynamic RAM), SRAM (static RAM) and Flash memory. MRAM can perform read and write operations much faster (by orders of magnitude) than conventional long-term storage devices such as hard drives. In addition, MRAM is more compact and consumes less power than hard drives. MRAM is also being considered for embedded applications such as extremely fast processors and network appliances.

A typical MRAM device includes an array of magneto-resistive elements used as memory cells. The rows of the MRAM device are typically referred to as word lines, while the columns of the MRAM device are typically referred to as bit lines (rows and columns being relative terms). Each memory cell is located at a cross point of a word line and a bit line.

The data layer of a memory cell is read as either a 0 or a 1, depending on the orientation of its magnetization relative to the reference layer. Associated with a magnetized layer such as the data layer is a characteristic referred to as coercivity. Coercivity can be thought of as the amount of force associated with maintaining the magnetization orientation of the data layer. In other words, to flip (switch) the data layer from one logic value to another (from 0 to 1 or vice versa), an external magnetic field greater than the coercivity of the data layer needs to be applied. To switch a selected memory cell, electrical currents are applied to the bit line and the word line corresponding to the selected memory cell. In the memory cell at the intersection of the bit line and the word line, the magnetic field generated by the electrical currents will be enough to exceed the coercivity threshold, causing the bit to flip (that is, the data layer of the memory cell will change orientation).

The design of MRAM devices involves, among other things, striking a proper balance between coercivity and the current applied to the bit and word lines. If coercivity is too low, memory cells may be unstable, switching logic values when the coercivity threshold is inadvertently exceeded due to thermal fluctuations, for example. Increasing the coercivity means increasing the currents applied to the bit and word lines. However, the maximum current that can be driven through the lines is limited by the maximum current density of the lines. Also, increasing the current is undesirable from a power consumption point of view. Moreover, increasing the current may require larger write current driver transistors and thus may increase overhead, which may affect memory density.

In summary, it is desirable to increase the maximum switching field (the external magnetic field) that can be applied to magneto-resistive devices, without increasing the currents applied to the bit and word lines. Increasing the maximum switching field would allow the coercivity of the magneto-resistive devices to be increased. Increasing the coercivity, in turn, would increase the integrity of data written to memory cells and would reduce the undesirable side effect of inadvertent bit flipping. However, the prior art is problematic because an increase in coercivity is accompanied by an increase in current or a reduction in the density of the magneto-resistive devices.

SUMMARY

Embodiments of a device having a magneto-resistive element, a first conductor proximate to the magneto-resistive element, and a second conductor proximate to the magneto-resistive element are described. The magneto-resistive element is exposed to a magnetic field generated by a first electrical pulse carried by the first conductor. The magneto-resistive element is also exposed to a magnetic field generated by a second electrical pulse carried by the second conductor. The second electrical pulse is delayed relative to the first electrical pulse.

DETAILED DESCRIPTION

As an overview, the embodiments of the present invention pertain to an array of magneto-resistive elements that, in one embodiment, are used as memory cells in a magnetic random access memory (MRAM) device. Electrical pulses are applied to conductors (e.g., bit and word lines) to generate a switching field that is used for changing the magnetization orientation of the data layer of a selected magneto-resistive element. By offsetting conductors relative to the magneto-resistive elements, the magnitude of the switching field can be enhanced. According to various embodiments of the present invention, the magnitude of the switching field can be further enhanced by staggering the electrical pulses applied to the conductors (e.g., delaying one electrical pulse relative to another).

The embodiments of the present invention are described in the context of an MRAM; however, the features of the present invention are not limited to MRAM devices. Aspects of the present invention may be applied to other devices such as magnetic sensor arrays, in which adjacent conductors enhance the magnetic fields applied to magneto-resistive elements in the arrays. In general, aspects of the present invention may be applied to a device that includes an array of magneto-resistive elements.

Figure 1:
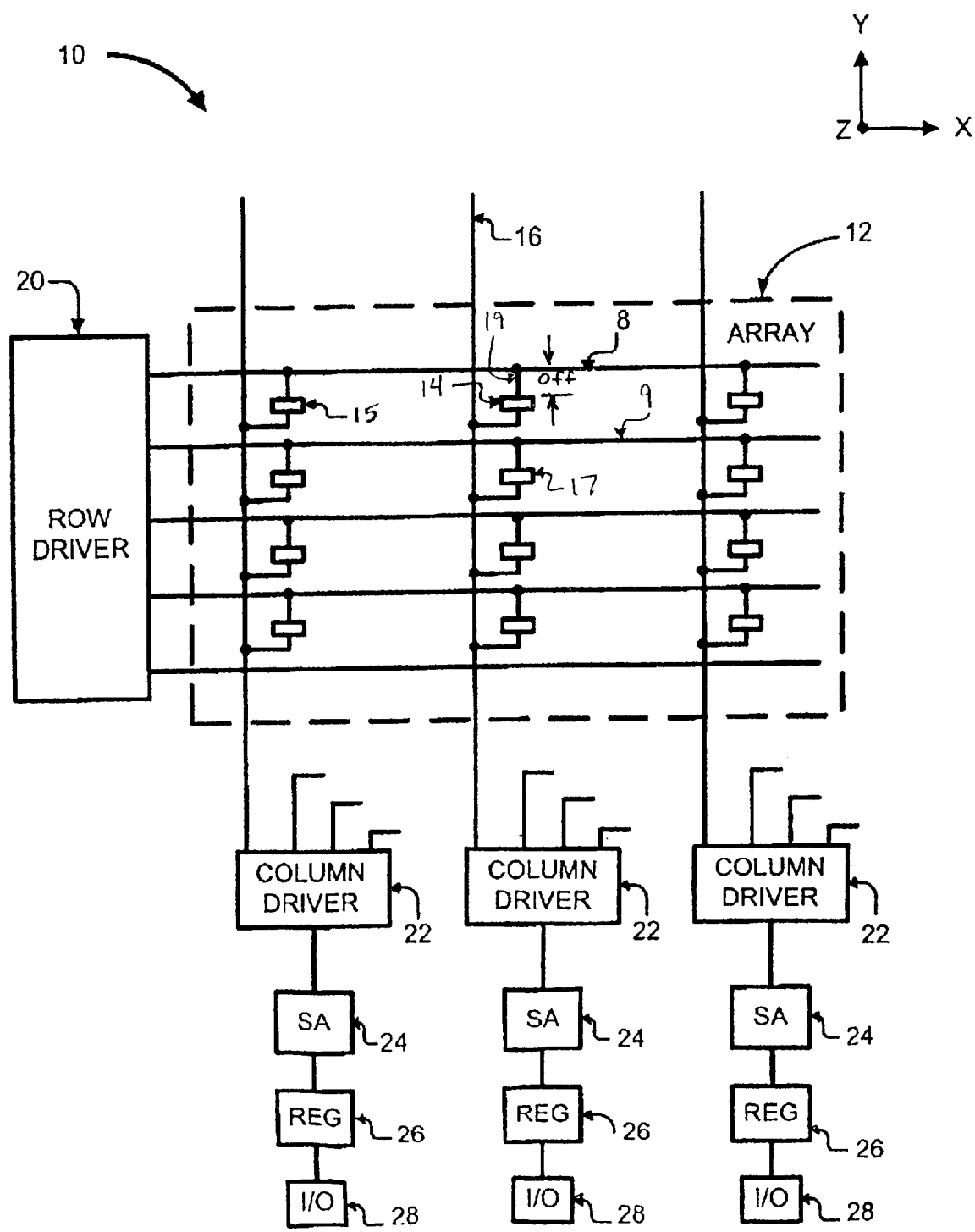
FIG. 1 is a block diagram of one embodiment of an MRAM device in accordance with the present invention.

Reference is made to FIG. 1, which illustrates one embodiment of an MRAM device 10 including a resistive cross point array 12 of magnetic memory cells exemplified by memory cells 14, 15 and 17. The magnetic memory cells of MRAM device 10 may include magneto-resistive devices such as tunneling magneto-resistive devices or giant magneto-resistive devices. The memory cells of MRAM device 10 are arranged in rows and columns, with the rows extending along an x-direction and the columns extending along a y-direction (such directions are relative). Only a relatively small number of the memory cells of MRAM device 10 are shown to simplify the illustration. In practice, arrays of any size may be used.

In the present embodiment, traces (or conductors) function as bit lines (exemplified by bit line 16) that extend in the y-direction, substantially parallel to the columns of memory cells of array 12. Also in the present embodiment, traces function as word lines (exemplified by word lines 8 and 9) that extend along the x-direction in a plane, substantially parallel to the rows of memory cells of array 12.

In a conventional MRAM device, each memory cell would be located at a cross point of a word-line and a bit line. In the MRAM device 10 of FIG. 1, in contrast, there is an offset in the y-direction between the memory cells in array 12 and the word lines. In FIG. 1, this offset is referenced by the letters "Off." Generally speaking, using memory cell 14 as a reference point, word line 8 is offset in one direction from the midpoint of memory cell 14 and word line 9 is offset in the other direction from the midpoint of memory cell 14. Viewed another way, memory cells 14 and 15 form a rank of memory cells, with word line 8 running parallel to the rank and offset in one direction from the midline of the rank, and with word line 9 also running parallel to the rank and offset the other direction from the midline of the rank.

Thus, according to the present embodiment, each memory cell in array 12 is located between two adjacent word lines. For example, memory cell 14 is located between word lines 8 and 9. In one embodiment, each memory cell in array 12 is overlapped by two adjacent word lines.

In the present embodiment, each memory cell in array 12 is electrically coupled to a bit line and one of the adjacent word lines. For example, memory cell 14 is coupled to bit line 16 and word line 8. In one embodiment, the electrical connections between the memory cells in array 12 and the word lines 8 are made by vias 19.

In the present embodiment, the MRAM device 10 includes a row driver 20 and column drivers 22 for supplying currents to selected bit lines and selected word lines during, for example, write operations. The MRAM device 10 further includes sense amplifiers (SA) 24 connected to the column drivers 22. Outputs of the sense amplifiers 24 are coupled to data registers (REG) 26, and outputs of the data registers 26 are coupled to input/output pads (I/O) 28 of the MRAM device 10. The sense amplifiers 24 sense the resistance states of selected memory cells in array 12 during read operations, for example. A simple sensing method may be performed by applying a voltage across a selected memory cell, and sensing the current flowing through the selected memory cell.

The memory cells in array 12 are coupled together through many parallel paths. The resistance seen at one connection equals the resistance of the memory cell at that connection in parallel with resistances of memory cells in the other rows and columns. Thus, the array 12 of memory cells may be characterized as a cross point resistor network.

Because the memory cells of array 12 are connected as a cross point resistor network, parasitic or sneak path currents can interfere with the read operations on selected memory cells. Blocking devices such as diodes or transistors may be connected to the memory cells of array 12. These blocking devices can block the parasitic currents. Alternative methods known in the art may be used to deal with parasitic currents. In one such method, the column drivers 22 may provide the same potential to unselected bit lines as is provided to a selected bit line, or the row driver 20 may provide the same potential to unselected word lines as is provided to a selected bit line.

Figure 2:
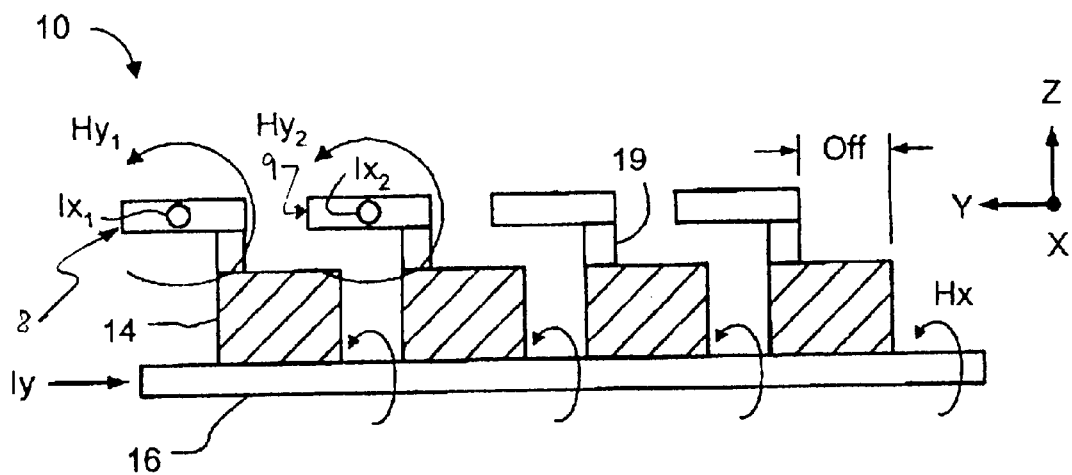
FIG. 2 is a cross-sectional view of the MRAM device of FIG. 1 according to one embodiment of the present invention.

FIG. 2 is a cross-sectional view of a portion of the MRAM device 10 of FIG. 1 according to one embodiment of the present invention. In this embodiment, current Iy is supplied to selected bit line 16 and currents $Ix_1$ and $Ix_2$ are supplied to selected word lines 8 and 9 during, for example, write operations. The currents Iy, $Ix_1$ and $Ix_2$ induce magnetic fields Hx, $Hy_1$ and $Hy_2$, respectively, about the selected bit line 16 and word lines 8 and 9. Note that, in practice, the currents Iy, $Ix_1$ and $Ix_2$ are rapidly applied and removed to the bit and word lines; that is, the currents are not steady but instead are turned on and off depending on which memory cell is selected. Accordingly, the currents Iy, $Ix_1$ and $Ix_2$ can be thought of as electrical pulses.

Consider a write operation to an exemplary memory cell 14. At the beginning of the write operation, currents Iy, $Ix_1$ and $Ix_2$ are applied to bit line 16 and word lines 8 and 9, respectively. Because memory cell 14 lies between two selected adjacent word lines 8 and 9 and over selected bit line 16, memory cell 14 is exposed to magnetic fields Hx, $Hy_1$ and $Hy_2$. The magnetic fields Hx, $Hy_1$ and $Hy_2$, when combined, are strong enough to change the magnetization orientation of memory cell 14. Significantly, if memory cell 14 is exposed to less than the combined magnetic fields Hx, Hy$_1$ and Hy$_2$ (e.g., some combination of only one or two of these magnetic fields), then the magnetization orientation of memory cell 14 is not changed. At the conclusion of the write operation to memory cell 14, the currents Iy, Ix$_1$ and Ix$_2$ are switched off (or perhaps applied to other bit and word lines corresponding to the next memory cell to be written to).

Reference is now made back to FIG. 1. Non-selected memory cells are exposed to only one or two of the three magnetic fields Hx, Hy$_1$ and Hy$_2$; therefore, the magnetization orientations of non-selected cells should not be affected. For example, consider the case in which memory cell 14 is selected for a write operation. Accordingly, currents will be applied to word lines 8 and 9 and to bit line 16. However, memory cell 15 will only be exposed to magnetic fields Hy$_1$ and Hy$_2$ induced by currents Ix$_1$ and Ix$_2$ in word lines 8 and 9, respectively. Similarly, memory cell 17 will only be exposed to magnetic fields Hx and Hy$_2$ induced by currents Iy and Ix$_2$ in bit line 16 and word line 9, respectively. Consequently, the magnetization orientation of memory cell 14 can be changed, while the magnetization orientations of memory cells 15 and 17 should not be affected.

The combined magnetic field of two adjacent word lines, offset from a memory cell as in MRAM device 10, is found to provide a stronger magnetic field on the memory cell than a single word line that is not offset. That is, the net magnetic field from two conductors is greater than that from a single conductor. Consequently, for a given amount of current, each memory cell can be exposed to a stronger switching field by offsetting the conductors from the memory cells. Conversely, to achieve a given switching field strength, the word lines of array 12 may be driven at less than maximum rated current capacity. It may also be possible to reduce the current applied to the bit lines. Moreover, unequal currents may be supplied to the bit lines and word lines of array 12.

Although MRAM device 10 has been described in the context of offsets between memory cells and word lines, it is appreciated that the bit lines may instead be offset, or word lines and bit lines may both be offset. Also, the word and bit lines may be transposed from what is shown and described.

Figure 4:
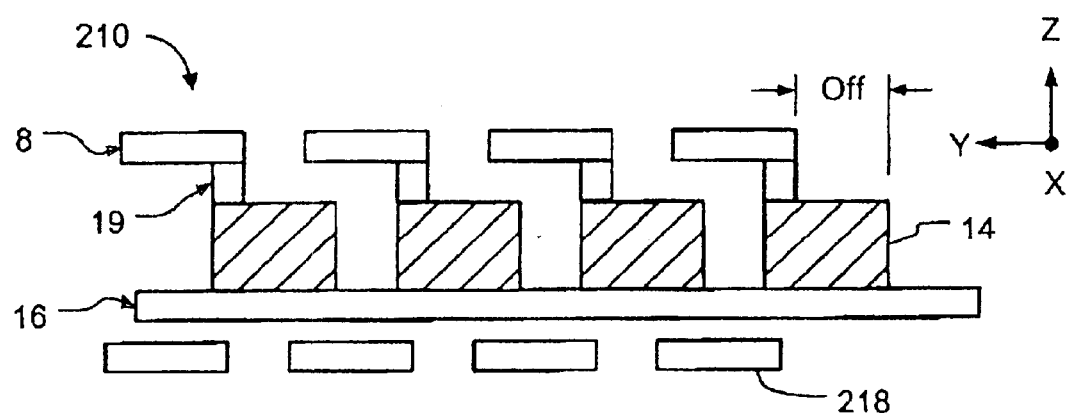
FIG. 4 is a cross-sectional view of the MRAM device of FIG. 3 according to one embodiment of the present invention.
Figure 3:
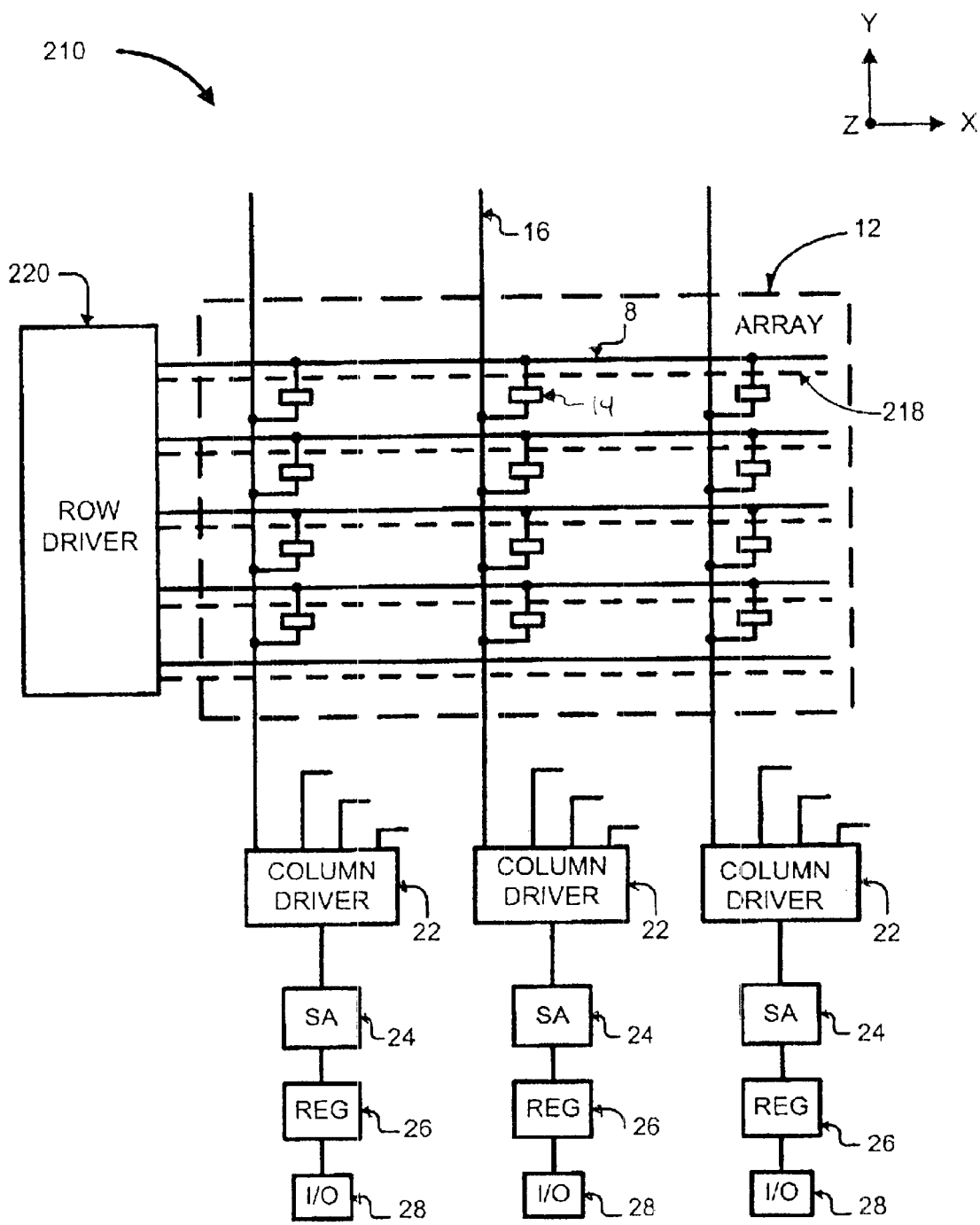
FIG. 3 is a block diagram of another embodiment of an MRAM device in accordance with the present invention.

In other embodiments, additional levels of conductors may be added for the word lines only, for the bit lines only, or for the word lines and the bit lines. FIGS. 3 and 4 illustrate an MRAM device 210 that is similar to MRAM device 10 of FIGS. 1 and 2, except that MRAM device 210 further includes a level of second word lines 218. The second word lines 218 extend along the x-direction in parallel with the word lines 8. In one embodiment, the second word lines 218 are adjacent to word lines 8; that is, a word line 218 and a corresponding word line 8 are each located on the same side of a row of memory cells. In the present embodiment, the second word lines 218 are beneath the bit lines 16. The second word lines 218 are electrically insulated from the bit lines 16 and the memory cells of array 12.

In the present embodiment, row driver 220 supplies currents to the first word lines 8 and the second word lines 218 during write operations, for If example. However, when currents are supplied to the two second word lines 218 nearest a selected memory cell (e.g., memory cell 14), as well as a crossing bit line 16 and the two first word lines 8 nearest the selected memory cell 14, the selected memory cell is exposed to magnetic fields from five lines. Thus, the second word lines 218 further increase the switching field.

Figure 5:
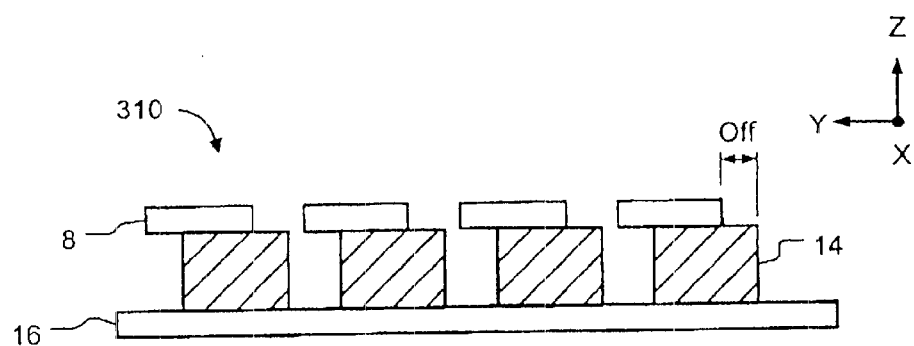
FIGS. 5, 6 and 7 illustrate various other embodiments of MRAM devices according to the present invention.

Although the MRAM devices 10 and 210 of FIGS. 1 through 4 were described with a plurality of vias 19, the present invention is not so limited. Instead, both the word and bit lines may be in direct electrical contact with the magnetic memory cells. FIG. 5, for example, shows an MRAM device 310 in which the word lines 8 are offset with respect to the memory cells 14. The amount of the offset (Off) in the y-direction is such that each memory cell 14 is electrically connected to only one of the two nearest word lines 8. During a write operation, for example, currents flowing through the bit line 16 and the two nearest word lines 8 are large enough to switch only the selected memory cell 14.

Figure 6:
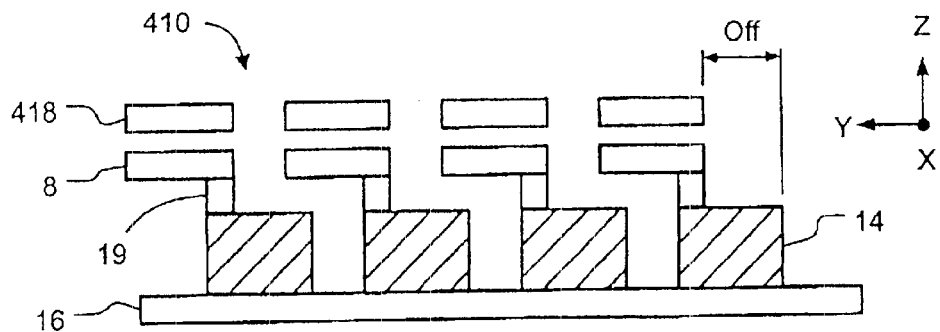
Figure 7:
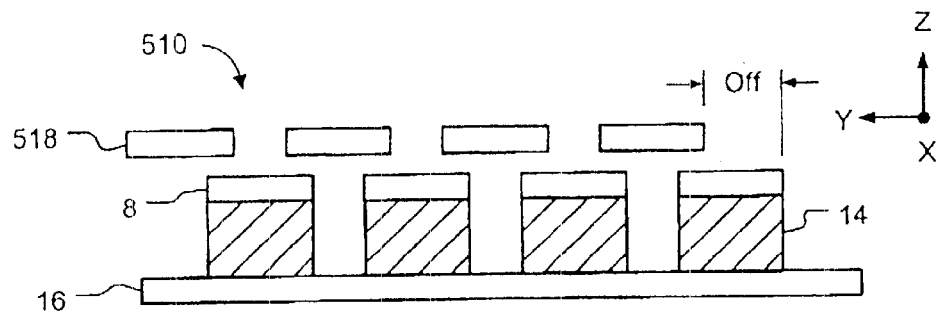

Additional levels of conductors may be fabricated. These additional levels may be spaced apart from the word and/or bit lines in a z-direction (the z-direction is orthogonal to the x- and y-directions). FIG. 6, for example, shows an MRAM device 410 in which an additional level of second word lines 418 is directly above and aligned with the first word lines 8. Thus, the second word lines-418 are also offset (Off) in the y-direction from the memory cells 14. FIG. 7 for example, shows an MRAM device 510 in which the second conductors 518 are offset (Off) from the memory cells 14 in the y-direction. However, the first word lines 8 are not offset. Moreover, the first word lines 8 are in direct contact and aligned with the memory cells 14.

USING DELAYED ELECTRICAL PULSES WITH MAGNETO-RESISTIVE DEVICES

As described above, by offsetting the conductors (e.g., the bit and/or word lines) from the magneto-resistive elements (e.g., the memory cells), the switching field of a device (e.g., an MRAM device) can be enhanced for a given current. In the embodiments described below, the switching field is further enhanced by delaying (e.g., staggering) the electrical pulses through the conductors.

For example, in one embodiment, two adjacent conductors are used in combination with a third conductor (orthogonal to the first and second conductors) to generate the switching field. According to the embodiments of the present invention described below, an electrical pulse carried by one of the adjacent conductors is delayed relative to an electrical pulse carried by the other adjacent conductor. This scheme can be extended to embodiments in which more than two adjacent conductors are used.

Figure 8:
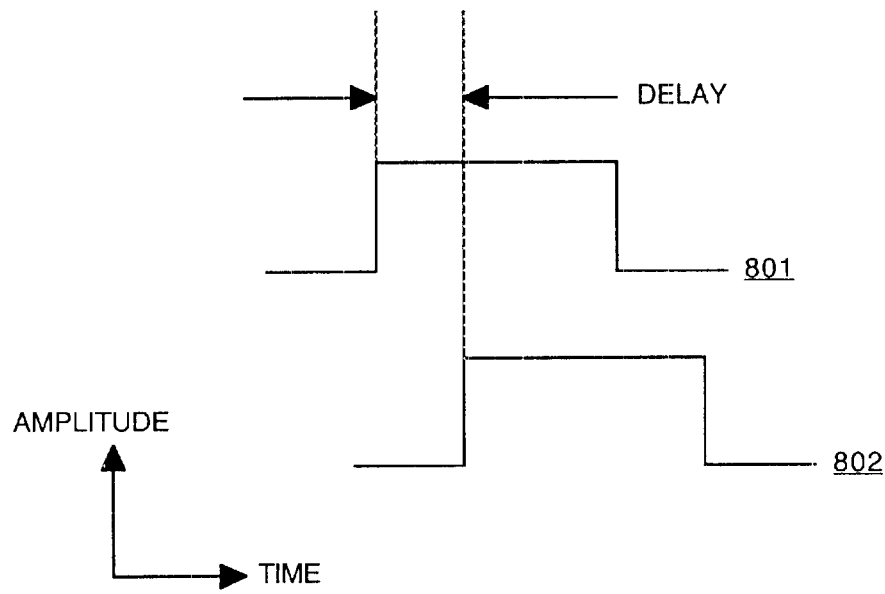
FIG. 8 illustrates a first electrical pulse and a delayed second electrical pulse according to one embodiment of the present invention.

FIG. 8 illustrates a first electrical pulse 801 and a second electrical pulse 802 according to one embodiment of the present invention. In this embodiment, the second electrical pulse 802 is delayed relative to the first electrical pulse 801. In one embodiment, the amount of delay is less than the duration of first electrical pulse 801, such that the two electrical pulses overlap. In one such embodiment, the amount of delay is less than approximately one nanosecond.

With reference also to FIG. 1, consider a write operation to an exemplary memory cell 14. At the beginning of the write operation, currents Iy, Ix$_1$ (e.g., first electrical pulse 801) and Ix$_2$ (e.g., second electrical pulse 802) are applied to bit line 16 and word lines 8 and 9, respectively. As described above, in the present embodiment, there is a slight delay between the electrical pulses 801 and 802, and hence first electrical pulse 801 carried by word line 8 will reach memory cell 14 before second electrical pulse 802 carried by word line 9. The electrical pulse carried by bit line 16 (a third electrical pulse) occurs coincident with electrical pulses 801 and 802, such that the third electrical pulse overlaps both electrical pulses 801 and 802. That is, the generation of the electrical pulse carried by bit line 16 is timed so that the third electrical pulse will occur at least during the period in which the first and second electrical pulses 801 and 802 overlap. It is appreciated that, as mentioned previously herein, the word and bit lines may be transposed from what is shown and described.

Because memory cell 14 lies between two selected adjacent word lines 8 and 9 and over selected bit line 16, memory cell 14 is exposed to magnetic fields Hx, $Hy_1$ and $Hy_2$. According to the present embodiment of the present invention, memory cell 14 will be exposed first to magnetic field $Hy_1$ and then to magnetic field $Hy_2$. However, there is some degree of overlap between the magnetic fields $Hy_1$ and $Hy_2$, depending on the amount of overlap between first electrical pulse 801 and second electrical pulse 802. Magnetic field Hx will also overlap magnetic fields $Hy_1$ and $Hy_2$ at least during the period in which the magnetic fields $Hy_1$ and $Hy_2$ are overlapped. The magnetic fields Hx, $Hy_1$ and $Hy_2$, when combined, are strong enough to change the magnetization orientation of memory cell 14. The delay in electrical pulses has the effect of causing one part of the data layer to move away from the stable position along the easy-axis switch before the rest of the data layer. The first electrical pulse 801 starts the switching of part of the data layer, and then the second electrical pulse 802 arrives to complete the switching of this part. The switch of this part of the data layer will propagate and the rest of the data layer will follow. Refer to FIGS. 10A through 10D below. By leveraging this higher torque effect to cause the switch, a reduced switching current can be used, or the same current can be used with higher coercivity of the data layer.

Although described for the embodiment of FIG. 1, the feature of a delayed electrical pulse can be extended to other embodiments such as those described in conjunction with FIGS. 3 through 7. Also, although described for adjacent word lines, delayed electrical pulses can be used with adjacent bit lines. It is also contemplated that the delay in electrical pulses can be applied in a combination of bit and word lines.

Figure 9:
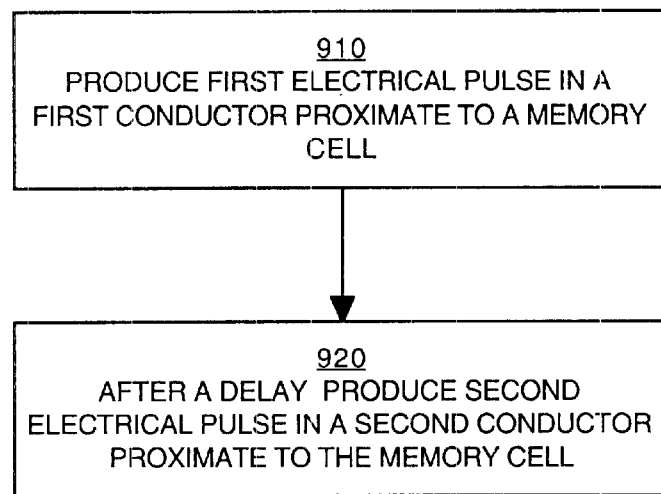
FIG. 9 is a flowchart of a method of writing to an MRAM device according to one embodiment of the present invention.

FIG. 9 is a flowchart 900 of a method of writing to an MRAM device according to one embodiment of the present invention. In step 910, in the present embodiment, a first electrical pulse is produced in a first conductor proximate to a memory cell, such that the memory cell is exposed to a magnetic field that is generated by the first electrical pulse. In step 920, in the present embodiment, a second electrical pulse is produced after a delay; that is, the second electrical pulse is delayed relative to the first electrical pulse. The second electrical pulse is carried by a second conductor also proximate to the memory cell, such that the memory cell is exposed to a magnetic field that is generated by the second electrical pulse. In one embodiment, the second conductor is disposed substantially parallel to the first conductor. In general, the first and second conductors are offset from the memory cell.

Figure 10A:
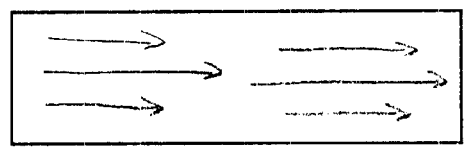
FIGS. 10A, 10B, 10C and 10D illustrate a magneto-resistive element undergoing a change in magnetization orientation according to one embodiment of the present invention.

FIG. 10A, 10B, 10C and 10D illustrate a data layer 1010 of a magneto-resistive element undergoing a change in magnetization orientation according to one embodiment of the present invention. In FIG. 10A, data layer 1010 has a magnetization orientation essentially in one direction. It is appreciated that there may be local variations of orientation within data layer 1010; however, the data layer 1010 has a general orientation relative to a reference layer (not shown). For the convenience of the discussion herein, the orientation of data layer 1010 is initially to the right, and the change in orientation is illustrated as counter-clockwise, starting from the right-hand side of data layer 1010.

Figure 10B:
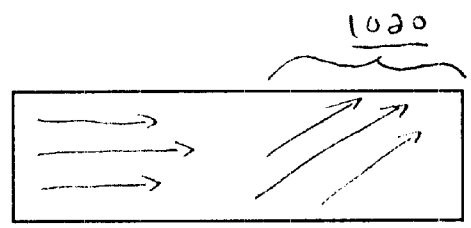

FIG. 10B shows the onset of a change in magnetization orientation of data layer 1010 under the influence of delayed electrical pulses applied using offset conductors. In accordance with the present embodiment of the present invention, data layer 1010 starts switching at one end (domain 1020) under the influence of first electrical pulse 801 (FIG. 8).

Figure 10C:
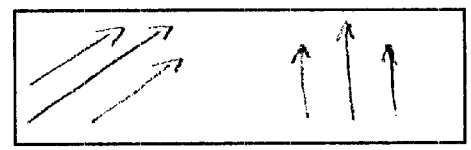
Figure 10D:
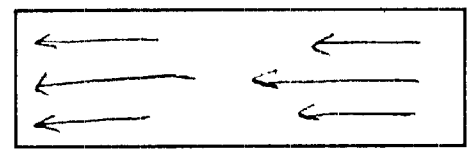

In FIG. 10C, the change in magnetization orientation is shown as continuing under the sustained influence of the first electrical pulse 801 and after the introduction of second electrical pulse 802 (FIG. 8) at the other end of data layer 1010. In FIG. 10D, the switch in magnetization orientation is complete.

A conductor to one side of a magneto-resistive element (e.g., a memory cell) will expose that side to a slightly higher switching field, and thus can cause nucleation of the switching domain on that side. The bit (data layer) then switches from that side to the other preferentially. This asymmetrical switching of the data layer leads it to exhibit a slightly lower coercivity, up to about one-third less. Thus, the switching field and, by implication, the switching current required to flip the bit are lowered.

When two offset conductors are used, in accordance with one embodiment of the present invention, the delayed application of the field-generating current in the conductors improves the switching response even further. The data layer starts switching at one end under the influence of the first electrical pulse. The delayed arrival of the second electrical pulse at the other end of the data layer after nucleation of the switching domain has already started. This can further reduce the coercivity. Consequently, the switching field and, by implication, the switching current required to flip the bit are also further reduced. In addition, the switching time can be reduced for a given amount of current.

Another benefit is that the switching pattern of the data layer is much cleaner; that is, the uniformity of the magnetization orientation of the data layer should be improved. This is expected to result in cleaner and better regulated switching of the bit. As a consequence, the noise in the conductors should be reduced. In addition, the switching properties across an array, and also across an entire device or a whole wafer, should be more uniform and thereby improved.

In summary, the various embodiments of the present invention provide significantly higher switching fields than conventional devices having the same conductor spacing, size and current density. The capacity for higher switching fields allows the coercivity of the magneto-resistive elements (e.g., memory cells) to be increased, thereby increasing the integrity of data written to memory cells and reducing the frequency of inadvertent bit flipping.

In the alternative, the current requirements for conductors (e.g., the word and bit lines) can be reduced for a given switching field. Reducing the current requirements for a given field can reduce heat loads in the device and can reduce overall power consumption. Conductors may be placed closer together, allowing a greater density of magneto-resistive elements.

The preferred embodiments of the present invention are thus described. While the present invention has been described in particular embodiments, it should be appreciated that the present invention should not be construed as limited by such embodiments, but rather construed according to the below claims.

What is claimed is:

1. A device comprising:
    a magneto-resistive element;
    a first conductor proximate to said magneto-resistive element, wherein said magneto-resistive element is exposed to a magnetic field generated by a first electrical pulse carried by said first conductor; and a second conductor proximate to said magneto-resistive element, wherein said magneto-resistive element is exposed to a magnetic field generated by a second electrical pulse carried by said second conductor, said second electrical pulse delayed relative to said first electrical pulse.

2. The device of claim 1 wherein said first electrical pulse and said second electrical pulse have overlapping periods.

3. The device of claim 1 wherein said magneto-resistive element comprises a magnetic memory cell.

4. The device of claim 1 wherein said first conductor and said second conductor are offset from a midpoint of said magneto-resistive element.

5. The device of claim 1 further comprising a third conductor proximate to said magneto-resistive element, said third conductor substantially orthogonal to said first and second conductors, wherein said magneto-resistive element is exposed to a magnetic field generated by a third electrical pulse carried by said third conductor.

6. The device of claim 5 wherein said first and second electrical pulses in combination with said third electrical pulse are sufficient to switch said magneto-resistive element to a different magnetic orientation.

7. The device of claim 5 wherein said third conductor is offset from a midpoint of said magneto-resistive element.

8. A device comprising:

a rank of magneto-resistive elements;

a first conductor disposed substantially parallel to said rank and offset in a first direction from a midline of said rank; and a second conductor disposed substantially parallel to said rank and offset in a second direction from said midline, wherein a first electrical pulse carried by said first conductor and a second electrical pulse carried by said second conductor are used in combination to induce a change in magnetic orientation of one of said magneto-resistive elements, wherein said second electrical pulse is delayed relative to said first electrical pulse.

9. The device of claim 8 wherein said magneto-resistive elements comprise memory cells.

10. The device of claim 8 comprising:

a plurality of third conductors substantially orthogonal to said first and second conductors, wherein each magneto-resistive element in said rank of magneto-resistive elements adjoins at least one of said third conductors.

11. The device of claim 10 wherein said first and second electrical pulses in combination with a third electrical pulse carried by a third conductor adjoining said one of said magneto-resistive elements are sufficient to switch said one of said magneto-resistive elements to a different magnetic orientation.

12. The device of claim 10 wherein said third conductors are offset from a midpoint of an adjoining magneto-resistive element.

13. A method of applying magnetic fields to a magneto-resistive element, said method comprising:

producing a first electrical pulse carried by a first conductor proximate to said magneto-resistive element, said first electrical pulse inducing a magnetic field about said magneto-resistive element; and producing a second electrical pulse after said first electrical pulse is produced, said second electrical pulse carried by a second conductor proximate to said magneto-resistive element, said second electrical pulse also inducing a magnetic field about said magneto-resistive element.

14. The method of claim 13 wherein said first electrical pulse and said second electrical pulse have overlapping periods.

15. The method of claim 13 wherein said second electrical pulse is produced less than approximately one nano-second after said first electrical pulse.

16. The method of claim 13 wherein said magneto-resistive element comprises a magnetic memory cell.

17. The method of claim 13 wherein said first conductor and said second conductor are offset from a midpoint of said magneto-resistive element.

18. The method of claim 13 further comprising:

producing a third electrical pulse coincident with said first and second electrical pulses, said third electrical pulse carried by a third conductor proximate to said magneto-resistive element and substantially orthogonal to said first and second conductors, said third electrical pulse also inducing a magnetic field about said magneto-resistive element.

19. The method of claim 18 wherein said first and second electrical pulses in combination with said third electrical pulse are sufficient to switch said magneto-resistive element to a different magnetic orientation.

20. The device of claim 18 wherein said third conductor is offset from a midpoint of said magneto-resistive element.

* * * * *